United States Patent [19]

Mark et al.

[11] Patent Number: 4,495,475
[45] Date of Patent: Jan. 22, 1985

[54] RESIDUAL MODE PHASE LOCKED LOOP

[75] Inventors: John G. Mark, Pasadena; James R. Steele, Northridge; Craig C. Hansen, East Palo Alto, all of Calif.

[73] Assignee: Litton Systems, Inc., Woodland Hills, Calif.

[21] Appl. No.: 337,920

[22] Filed: Jan. 8, 1982

[51] Int. Cl.³ ............... H03L 7/08; H03B 1/12; H04B 15/00; H03D 3/24

[52] U.S. Cl. .................. 331/12; 331/8; 331/15; 331/17; 331/25; 328/167

[58] Field of Search .......... 328/167, 165; 331/1 R, 331/2, 8, 10, 11, 12, 15, 17, 25; 333/166, 167

[56] References Cited

U.S. PATENT DOCUMENTS

| | | | |
|---|---|---|---|
| 3,633,117 | 1/1972 | Reilly, Jr. | 307/512 X |
| 4,027,264 | 5/1977 | Gutleber | 328/167 |
| 4,037,165 | 7/1977 | Ogita | 331/25 X |

FOREIGN PATENT DOCUMENTS 2221524  1/1979  Fed. Rep. of Germany ...... 455/260

Primary Examiner—Eugene R. Laroche
Assistant Examiner—W. R. Paxman
Attorney, Agent, or Firm—Poms, Smith, Lande & Rose

[57] ABSTRACT

A phase locked loop is disclosed which subtracts an estimated signal from an input signal and operates upon the residual signal. The residual signal is demodulated and applied to a controlled oscillator which produces feedback signals approximately the sine and cosine of the input signal. The cosine feedback signal is multiplied by the residual signal whose resultant signal is a frequency correction signal. The sine feedback signal is multiplied by the residual signal for multiplication again by the sine feedback signal to produce the estimated signal which is amplitude and frequency controlled. This signal is then subtracted from the input signal to reduce the residual signal to near zero.

11 Claims, 3 Drawing Figures

RESIDUAL MODE PHASE LOCKED LOOP

BACKGROUND OF THE INVENTION

The present invention relates to a phase locked loop and, more particularly, to a phase locked loop which subtracts an estimate of the incoming signal from the actual signal to produce a residue signal that is then demodulated and utilized to control the loop.

The use of a phase locked loop in communication circuits in which a local oscillator is synchronized in phase and frequency with a received signal is well known. The technique of making the phase of the oscillator signal follow exactly the phase of an input reference signal by comparing the phases between the two signals and using the result of the difference signal to adjust the frequency of the local oscillator is also known. The adjustment is accomplished by comparing the input reference signal with the output of the local oscillator. Any phase difference between the two signals is converted to a correction voltage that causes the phase of the local oscillator output signal to change so that it tracks the input reference signal.

The output of the local oscillator multiplied by the input reference signal has a tendency to produce a ripple-like error signal. This ripple-like error signal is normally fed back into the local oscillator input control to produce a phase jitter at twice the frequency which is being generated by the phase locked loop.

SUMMARY OF THE INVENTION

Accordingly, it is an object of the present invention to provide a phase locked loop which does not have any ripple on the input control to the local oscillator during steady state operation.

Another object of this invention is to provide an output signal which has a better signal-to-noise level thus creating a circuit which is more accurate and which locks upon the desired frequency more rapidly than prior art circuits.

A further object of the invention is to provide a phase locked loop circuit which is capable of locking more than one frequency at a time thus lending itself to use in various circuits including signal separators, notch filters, and tracking filters.

In accomplishing these and other objects there is provided a phase locked loop which subtracts an estimate of the input signal from the actual signal to produce a residual signal at an input summing circuit. The residual signal is then multiplied by the sine and cosine of the output signal from a local oscillator, such as a voltage controlled oscillator (VCO). In a first feedback loop, the cosine output of the VCO demodulates the residual signal to produce an error signal. This error signal is integrated, amplified and used to control the frequency and phase of the voltage controlled oscillator. In a second feedback loop, the sine output of the VCO demodulates the residual signal and the error signal is amplified, integrated and used to control the amplitude of the voltage controlled oscillator signal. The phase and amplitude corrected feedback signal is then applied to the summing circuit where it is subtracted from the input signal to reduce the residual signal to near zero.

One advantage of the present invention is that more than one residual mode phase locked loop may be utilized to accomodate the removal of more than one frequency component from a composite input signal.

BRIEF DESCRIPTION OF THE DRAWINGS

Other objects and further advantages of the present invention will become apparent to those skilled in the art after a careful consideration of the following specification and accompanying drawings wherein.

DESCRIPTION OF THE PREFERRED EMBODIMENTS

Figure 1:
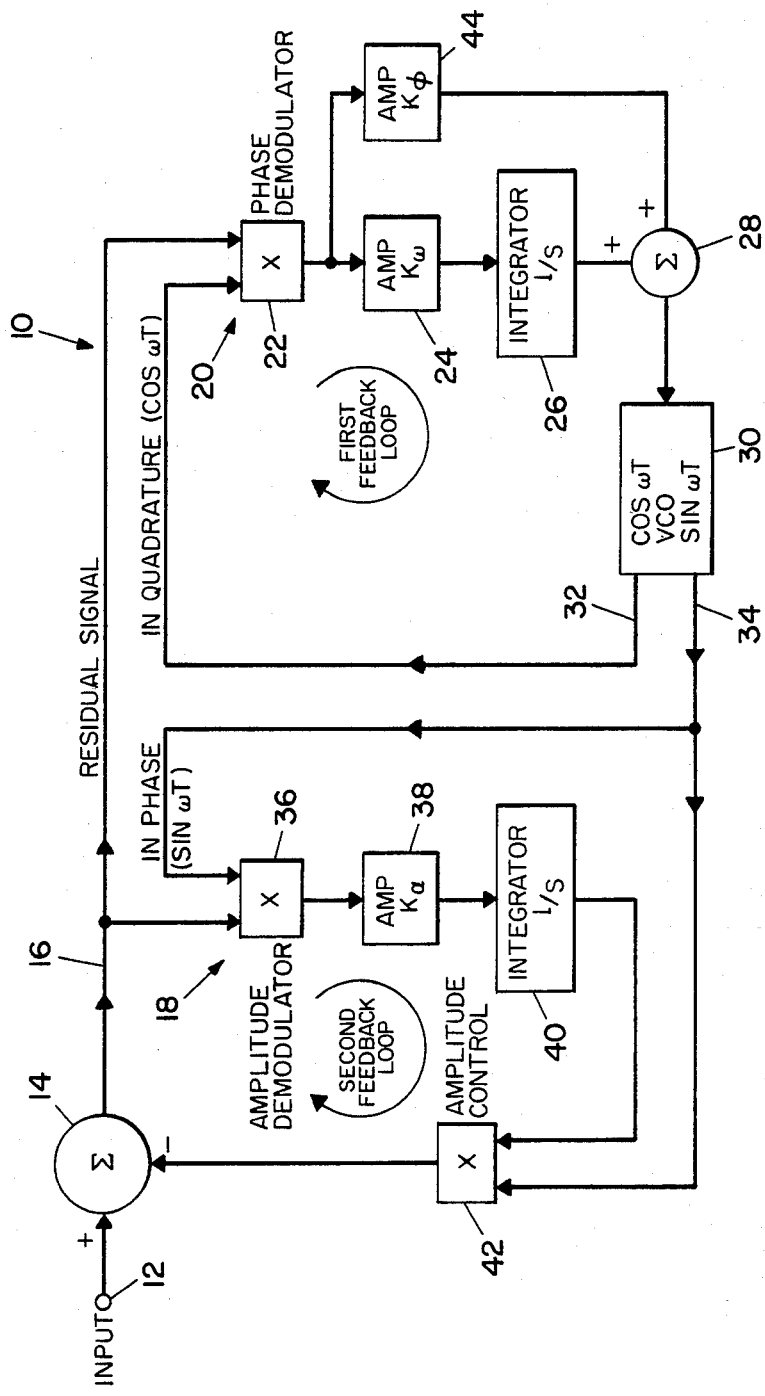
FIG. 1 is a schematic diagram showing a residual mode phase locked loop of the present invention.

Referring now to the drawings, FIG. 1 shows a residual mode phase locked loop 10 having an input terminal 12 which applies an input signal to a summing circuit 14. A local oscillator 30, with an amplitude control circuit 42, as further described in FIG. 2, generates an estimated signal which is substantially equal in frequency, phase and amplitude to that of the input signal at terminal 12. This estimated signal is then subtracted from the input signal in the summing circuit 14 leaving a residual signal that is applied over a residual line 16 to the input of an amplitude demodulator circuit 18 and phase demodulator circuit 20.

The phase demodulator circuit 20 includes a set of three serially connected electrical components and one parallel component including a multiplier 22, shown as block X, an amplifier 24, shown as block $K_w$, and an integrator 26, shown as block 1/S. The output of integrator 26 is connected to a summing circuit 28 with the output of a gain circuit 44, shown as block $K_\phi$, and then to the input terminal of the local oscillator 30 which may be a voltage, current, resistance or digital controlled oscillator. In the embodiment described here, a voltage controlled oscillator (VCO) 30 is used. The VCO 30 includes a pair of output terminals 32 and 34 whose output signals are sin ωt and cos ωt, respectively. The cos ωt output terminal 32 is then connected back to a second input of the multiplier 22 to produce a first feedback loop which is a frequency or phase controlled loop.

The sin ωt output at terminal 34 is connected to a second feedback loop at the amplitude demodulation circuit 18 which also receives an input signal from the residual signal line 16. The amplitude demodulation circuit 18 comprises serially connected components including a multiplier 36, labelled X, an amplifier 38, labeled $K_a$, and an integrator 40, labeled 1/S. The output from integrator 40 is applied to a third multiplier circuit 42, labeled X, along with the sin ωt output signal from terminal 34 of the voltage controlled oscillator 30. Multiplier 42 combines the two signals applied to it to form an amplitude control feedback circuit which is connected to the subtraction terminal of the summing circuit 14.

The circuit thus described receives an input signal at terminal 12 and generates a second signal substantially equal to the input signal. The circuit further generates a frequency and amplitude controlled feedback signal in two feedback loops. This signal is subtracted at summing circuit 14 from the input signal. The residual signal, which is the output of the summing circuit 14, is then multiplied by the sine and cosine of the voltage controlled oscillator 30 signals. The cosine demodulation signal from terminal 32 is multiplied by the residual signal, amplified and integrated for use to control the frequency of the voltage controlled oscillator. The sine demodulation signal from terminal 34 is also multiplied by the residual signal, amplified and integrated to control the amplitude of the voltage controlled oscillator feedback signal. This process effectively subtracts the voltage controlled oscillator signal from the input signal.

When there is a high frequency rapid variation of the input signal phase, a second feedback loop in the phase controlled loop may be desired. In this case, the second amplifier 44 may be connected to the terminal 28 from a junction between multiplier 22 and amplifier 24. In operation, the amplifier 44 may be a simple capacitor or the gain stage of an operational amplifier.

Figure 2:
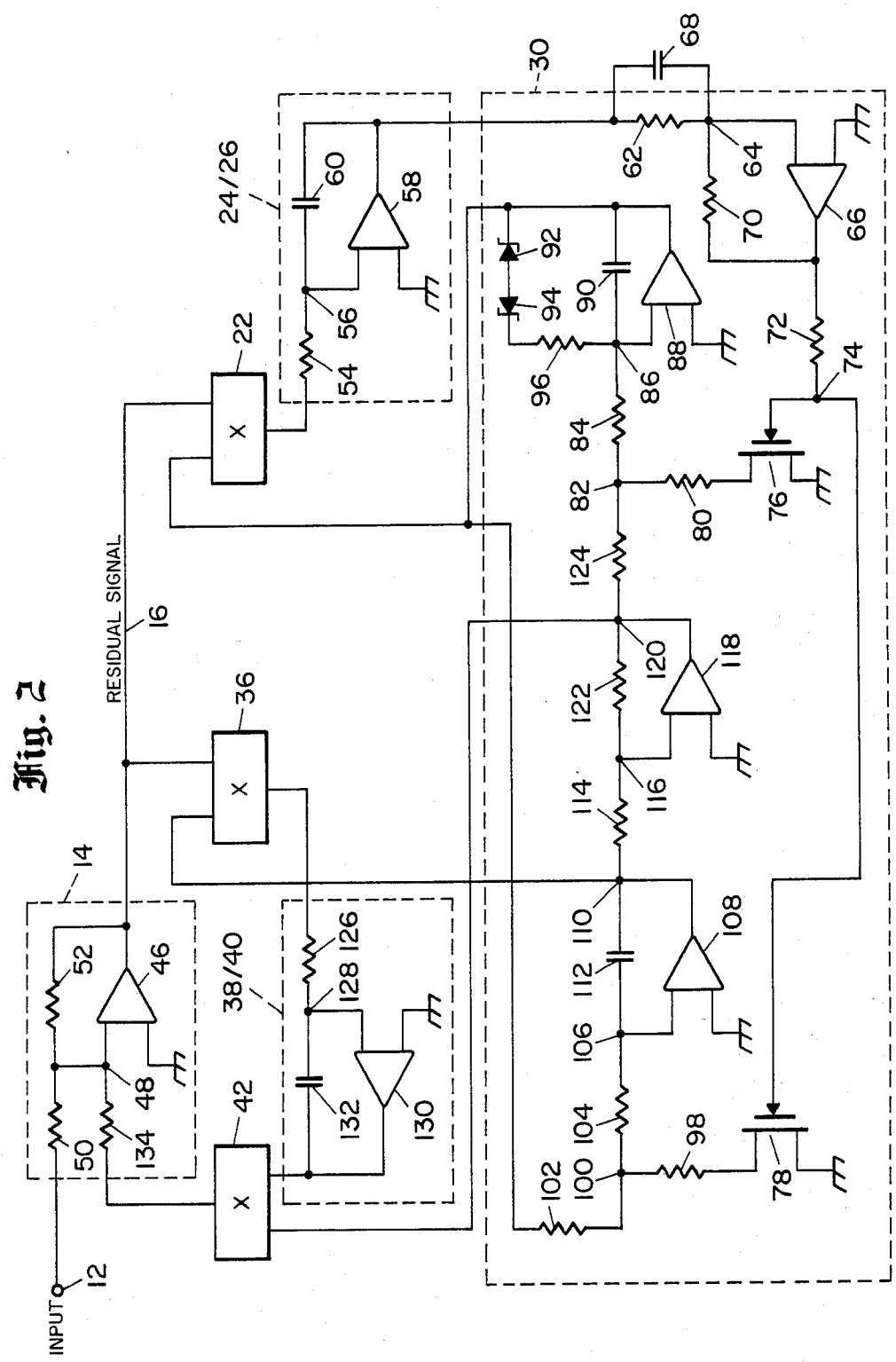
FIG. 2 is a more detailed diagram of the loop shown in FIG. 1.

Referring now to FIG. 2, the circuit described generally in FIG. 1 will be described in greater detail. Input terminal 12 connects to summing circuit 14 which comprises an operational amplifier 46 having one input terminal connected to ground while its second input terminal connects to a summing junction 48 which connects to terminal 12 through a resistor 50. The output of operational amplifier 46 connects through a feedback resistor 52 to summing junction 48 and over the residual signal line 16 to input terminals of the multipliers 22 and 36. Multiplier 22 which is part of the frequency control feedback loop connects through a resistor 54 to a summing junction 56 which connects to an input terminal of a operational amplifier 58 whose second input terminal connects to ground. The output of amplifier 58 connects through a feedback capacitor 60 to summing junction 56 and is connected through a resistor 62 to a summing junction 64 which connects to an input terminal of an operational amplifier 66. Connected from the output of operational amplifier 58 to the summing junction 64 is a capacitor 68 which performs the function of amplifier 44 in FIG. 1. Similarly, resistor 54, amplifier 58 and capacitor 60 form the function of the amplifier 24 and integrator 26 of FIG. 1.

The connection to resistor 62 from amplifier 58 represents the input connection to the voltage controlled oscillator 30 shown in FIG. 1. The second input terminal of operational amplifier 66 is connected to ground while its output terminal connects through a feedback resistor 70 to the summing junction 64 and through a resistor 72 to a node 74.

The node 74 is connected to a pair of field effect transistors or J-FETs 76 and 78. The gate of FET 76 connects to node 74 while the source connects to ground and the drain connects through a resistor 80 to a node 82. Node 82 connects through a resistor 84 to a summing junction 86 and then to an input terminal of another operational amplifier 88 whose second input terminal connects to ground. The output of operational amplifier 88 connects through a feedback capacitor 90 to summing junction 86 and through a pair of amplitude limiting zener diodes 92 and 94, wherein the cathode of diode 92 connects to the output of amplifier 88. The anode of diode 92 thereof connects to the anode of diode 94 whose cathode is connected through a resistor 96 to summing junction 86. The output of amplifier 88 also connects to an input terminal of multiplier 22 to complete the cos ωt portion of VCO 30.

Node 74 connects to the gate of FET 78 whose source connects to ground and whose drain is connected through a resistor 98 to a node 100. The node 100 is connected by a resistor 102 to the output from amplifier 88 and by a resistor 104 to a summing junction 106 and then to the input terminal of an operation amplifier 108 whose second input terminal connects to ground. The output of operation amplifier 108 connects to a node 110 which, in turn, connects to the summing junction 106 via a feedback capacitor 112. Node 110 is also connected to the second input terminal of multiplier 36 to apply a sin ωt signal to that multiplier.

A similar output signal (−sin ωt) is supplied by connecting node 110 through a resistor 114 to a summing junction 116 which connects to the input terminal of an operational amplifier 118. The second input terminal of operational amplifier 118 connects to ground while the output terminal thereof connects to a node 120. Node 120 is connected by a resistor 122 to summing junction 116 to provide a feedback for amplifier 118. Node 120 also connects via a resistor 124 to node 82 to complete the circuit of the voltage controlled oscillator 30.

The output signal from node 120 is applied to a first input terminal of multiplier 42. The output from multiplier 36 is connected via a resistor 126 to a summing junction 128 and then to the input terminal of an operational amplifier 130 whose second input terminal connects to ground. The output of amplifier 130 connects via a feedback capacitor 132 to summing junction 128 and to the second input terminal of mutliplier 42. Multiplier 42 then connects via a resistor 134 to summing junction 48 of summing circuit 14 to complete the circuit.

The operation of the circuit shown in FIG. 2 is similar to the operation described above with regard to FIG. 1. While the circuitry shown in FIG. 2 was constructed originally with analog components, it will be understood that the circuitry lends itself to digitized logic. In this circumstance, the multipliers 22 and 36 would become digital to analog converters while the multiplier 42 would become an analog to digital converter.

In operation, if the feedback signal cos ωt is not in quadrature with the residual signal, a direct current signal will be generated for application to the voltage controlled oscillator 30 which will change the frequency output of that oscillator to correct the cos ωt signal applied to the multiplier 22 and thus to bring the signal within the frequency control loop into frequency and phase collation with the residual signal. This frequency corrected signal is also applied to the circuit which generates the sin ωt signal. The sin ωt is compared with the residual signal. The resultant signal is integrated and compared with the −sin ωt signal for producing a cancelling signal which reduces the residual amplitude to near zero. Thus, the signal applied to the operational amplifier 46 from multiplier 42 through the resistor 134 reduces the input signal by subtracting the voltage controlled oscillator therefrom.

Although the foregoing summary has been written and illustrated for only one subtraction within summing circuit 14, it will be understood that more than one voltage controlled oscillator 30 and demodulation circuits 18 and 20 can be connected to the single summing circuit 14 formed by operational amplifier 46 and resistors 50, 52 and 134. Any number of signals can be separated in this manner by simply connecting the second multiplier 42 to the input terminal of operational amplifier 46 via a second resistor 134.

Figure 3:
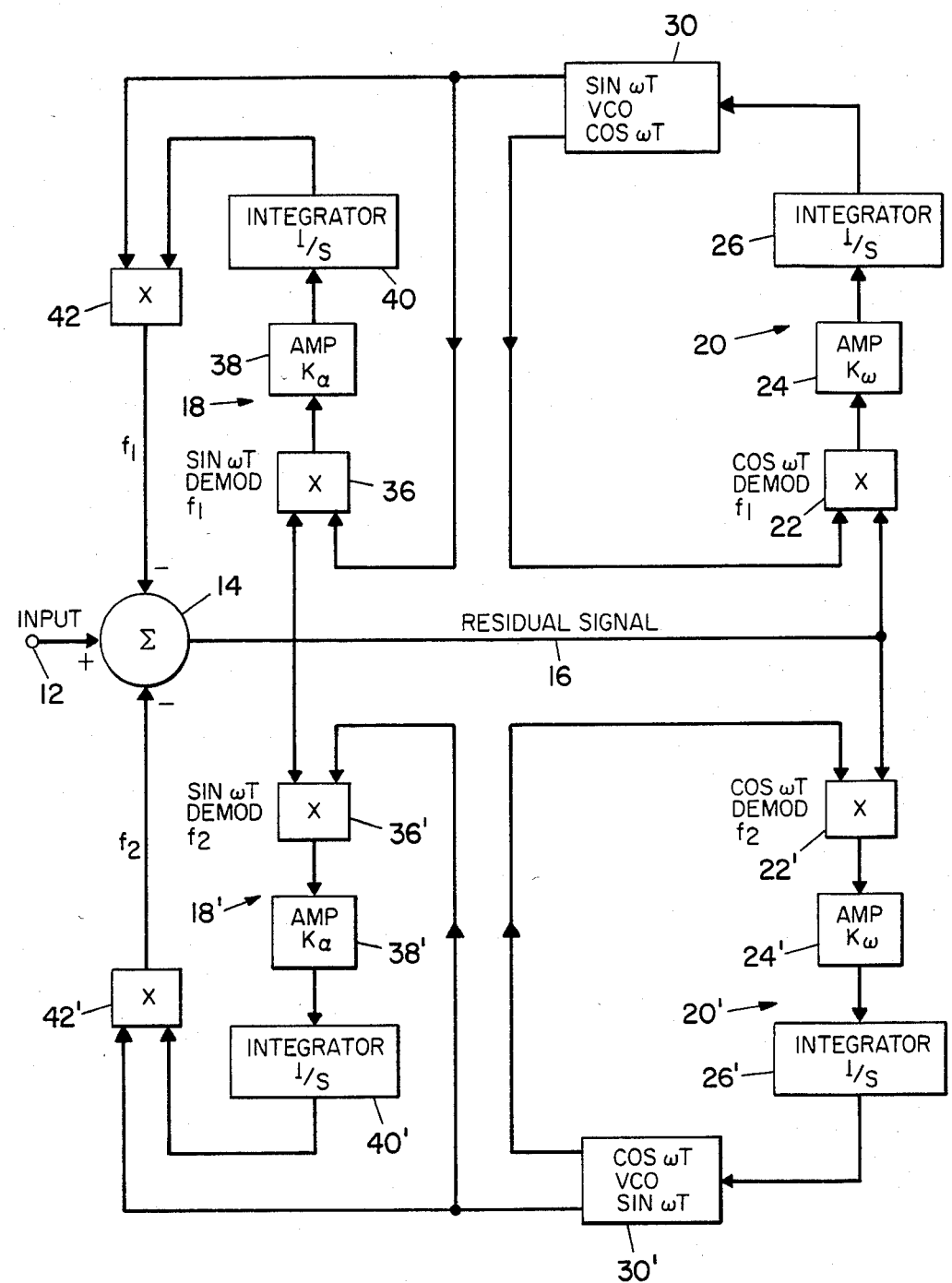
FIG. 3 is a schematic diagram showing a plurality of phase locked loops.

As illustrated in FIG. 3, two or more separate signals may be identified and eliminated from a composite input signal. As shown in FIG. 3, the circuit for eliminating a first frequency ($f_1$) is the same as the circuit shown in FIG. 1. A similar circuit to eliminate a second frequency ($f_2$) may be attached to the residual signal line 16 embodying similar components which, in FIG. 3, have been identified by primed numbers.

When more than one residual mode phase locked loop is utilized, the resulting circuit has application for various functions including signal separators, notched filters, and tracking filters.

While the present invention has been described utilizing analog components, it is also understood that digital version of the analog components may be utilized. For example, circuit types can be either analog or digital or other suitable logical embodiments. Thus, in a digital embodiment, the voltage controlled oscillator 30 could be substituted by another type of controlled oscillator, such as a numerically controlled oscillator. Further, any number of phase locked loops may be utilized. Clearly, other modifications will become apparent to those skilled in the art; and the present invention should be limited only by the appended claims.

We claim:

1. A phase locked loop, comprising;
    an input terminal for receiving an input signal;
    estimating means for producing an estimated input signal and means for subtracting said estimated input signal from said input signal to produce a residual signal;
    first means for demodulating said residual signal for producing a first demodulated residual signal;
    controlled oscillator means for receiving said first demodulated residual signal for producing first and second controlled oscillator signals in response to said first demodulated residual signal;
    first feedback means for applying said first oscillator signal to said first means for demodulating;
    second means for demodulating said residual signal for producing a second demodulated residual signal;
    second feedback means for applying said secod oscillator signal to said second means for demodulating;
    wherein said second oscillator signal and said second demodulated residual signal are applied to said estimating means for producing said estimated input signal; said residual signal being reduced to near zero.

2. A phase locked loop as claimed in claim 1, wherein:
    said first feedback means applies said first oscillator signal to said first means for demodulating to frequency control said second oscialltor signal applied to said second means for demodulating.

3. A phase locked loop, as claimed in claim 2, wherein:
    said first oscillator signal from said controlled oscillator means is in quadrature with said residual signal; and
    said second oscillator signal from said controlled oscillator means is in phase with said residual signal.

4. A phase locked loop, as claimed in claim 3, wherein said first and second means for demodulating said residual signal each include:
    a multiplier circuit,
    an amplifier circuit, and
    an integrator circuit serially connected wherein said multiplier circuits each receive said residual signal, and said integrator circuit in said first means for demodulating applies said first demodulated residual signal to said controlled oscillator means while said integrator circuit in said second means for demodulating applies said second demodulated residual signal to said estimating means.

5. A phase locked loop, as claimed in claim 4, wherein:
    said first feedback means is formed by connecting said first oscillator signal from said controlled oscillator means to a second input of said multiplier circuit in said first means for demodulating; and
    said second feedback means is formed by connecting said second oscillator signal from said controlled oscillator means to a second input of said multiplier circuit in said second means for demodulating.

6. A phase locked loop, as claimed in claim 1, wherein said means for subtracting includes:
    an operational amplifier having two input ports and an output port at which said residual signal appears;
    first resistive means connected between said input terminal and a summing junction, said summing junction, in turn, being connected to one of said input ports;
    second resistive means connected between said output port and said summing junction;
    third resistive means connected between said summing junction and said estimating means; and
    said second input port connected to ground.

7. A phase locked loop, as claimed in claim 1, wherein said controlled oscillator means comprises a voltage controlled oscillator.

8. A phase locked loop, as claimed in claim 1, wherein said controlled oscillator means comprises a numerically controlled oscillator.

9. Method for improving the output of a phase locked loop, comprising the steps of:
    applying an input signal to an input terminal;
    generating an estimated signal, substantially identical to said input signal,
    subtracting said estimated signal from said input signal to produce a residual signal of near zero level;
    applying said residual signal to a controlled oscillator means to produce first and second oscillator signals;
    comparing at said controlled oscillator means said residual signal with said first oscillator signal to correct said estimated signal for frequency by frequency controlling said first and second oscillator signals;
    comparing said residual signal with said second oscillator signal to produce an amplitude correction signal; and
    combining said second oscillator signal and said amplitude correction signal to form a signal corrected for frequency and amplitude;
    said signal corrected for frequency and amplitude being a new said estimated signal, said subtracting serving to further reduce the residual signal to a near zero level.

10. A method for improving the output of a phase locked loop, as claimed in claim 9 wherein each of said comparing steps comprise the steps of:
    multiplying said residual signal by the respective oscillator signal and amplifying and integrating the resultant signal.

11. A phase locked loop, comprising:

an input terminal for receiving a complete input signal;

a plurality of estimating means, each producing an estimated signal and means for subtracting the estimated signals from said composite input signal to produce a composite of residual signals;

a plurality of first means for demodulating, each being connected to receive one of said composite of residual signals for producing a plurality of first individual demodulated residual signals;

a plurality of controlled oscillator meas each being connected to receive one of said first individual demodulated residual signals and each producing first and second controlled oscillator signals in response to one of said first individual demodulated residual signals;

a plurality of first feedback means for applying said first oscillator signals to said plurality of first means for demodulating;

a plurality of second means for demodulating, each being connected to receive one of said composite of residual signals for producing a plurality of second individual demodulated residual signals;

a plurality of second feedback means for applying said second oscillator signals to said plurality of second means for demodulating;

wherein said second oscillator signals and said plurality of second individual demodulated residual signals are applied to said plurality of estimating means for producing the estimated signals; said composite of residual signals being reduced to near zero.

* * * * *